United States Patent
Miller et al.

(10) Patent No.: US 9,123,500 B2
(45) Date of Patent: Sep. 1, 2015

(54) AUTOMATED ION BEAM IDLE

(75) Inventors: Tom Miller, Portland, OR (US); Sean Kellogg, Portland, OR (US); Jiri Zbranek, Hillsboro, OR (US)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 13/436,916

(22) Filed: Mar. 31, 2012

(65) Prior Publication Data

US 2013/0256553 A1 Oct. 3, 2013

(51) Int. Cl.
*H01J 37/08* (2006.01)
*H01J 37/302* (2006.01)
*H01J 37/24* (2006.01)
*H01J 37/04* (2006.01)

(52) U.S. Cl.
CPC .............. *H01J 37/08* (2013.01); *H01J 37/045* (2013.01); *H01J 37/243* (2013.01); *H01J 37/302* (2013.01); *H01J 2237/043* (2013.01); *H01J 2237/0805* (2013.01); *H01J 2237/0817* (2013.01); *H01J 2237/30472* (2013.01); *H01J 2237/31749* (2013.01)

(58) Field of Classification Search
CPC ..... H01J 37/08; H01J 37/302; H01J 37/3023; H01J 37/045; H01J 37/043; H01J 37/243; H01J 2237/0805; H01J 2237/0817; H01J 2237/31749; H01J 2237/30472
USPC ......... 250/250, 251, 288, 291, 305, 306, 307, 250/310, 311, 396 R, 396 ML, 492.1, 250/492.21, 492.3
See application file for complete search history.

(56) References Cited

U.S. PATENT DOCUMENTS

| | | | | |
|---|---|---|---|---|
| 3,337,729 | A * | 8/1967 | Thomas et al. | 850/30 |
| 3,896,362 | A * | 7/1975 | Street | 318/640 |
| 5,126,163 | A * | 6/1992 | Chan | 427/531 |
| 5,338,939 | A * | 8/1994 | Nishino et al. | 250/396 ML |
| 5,378,899 | A * | 1/1995 | Kimber | 250/492.21 |
| 5,825,035 | A | 10/1998 | Mizumura et al. | |
| 5,982,101 | A | 11/1999 | Fremgen, Jr. et al. | |
| 6,914,386 | B2 | 7/2005 | Pearl | |
| 7,241,361 | B2 | 7/2007 | Keller et al. | |
| 7,491,947 | B2 * | 2/2009 | Cobb et al. | 250/426 |
| 7,670,455 | B2 | 3/2010 | Keller et al. | |
| 8,168,957 | B2 | 5/2012 | Keller et al. | |
| 2003/0161970 | A1 * | 8/2003 | Kaito | 427/595 |
| 2004/0169141 | A1 * | 9/2004 | Adamec et al. | 250/310 |
| 2005/0062480 | A1 * | 3/2005 | Pearl | 324/464 |
| 2005/0183667 | A1 * | 8/2005 | Keller et al. | 118/723.001 |
| 2006/0043312 | A1 * | 3/2006 | Siebert et al. | 250/398 |
| 2007/0120076 | A1 * | 5/2007 | Gehlke et al. | 250/492.21 |
| 2007/0158551 | A1 * | 7/2007 | Audebert et al. | 250/306 |

(Continued)

*Primary Examiner* — Phillip A Johnston
*Assistant Examiner* — Sean Luck
(74) *Attorney, Agent, or Firm* — Scheinberg & Associates; Michael O. Scheinberg; Nathan H. Calvert

(57) ABSTRACT

An improved method and apparatus for shutting down and restoring an ion beam in an ion beam system. Preferred embodiments provide a system for improved power control of a focused ion beam source, which utilizes an automatic detection of when a charged particle beam system is idle (the beam itself is not in use) and then automatically reducing the beam current to a degree where little or no ion milling occurs at any aperture plane in the ion column. Preferred embodiments include a controller operable to modify voltage to an extractor electrode and/or to reduce voltage to a source electrode when idle state of an ion source of the charged particle beam system is detected.

18 Claims, 5 Drawing Sheets

(56) References Cited

U.S. PATENT DOCUMENTS

| | | |
|---|---|---|
| 2008/0067445 A1 | 3/2008 | Kaga |
| 2008/0156998 A1* | 7/2008 | Sugiyama ................. 250/396 R |
| 2008/0283778 A1* | 11/2008 | Tomimatsu et al. ..... 250/492.21 |
| 2009/0134326 A1* | 5/2009 | Bandura et al. ............... 250/306 |
| 2009/0289191 A1* | 11/2009 | Frosien .................... 250/396 R |
| 2009/0309018 A1* | 12/2009 | Smith et al. .................... 250/282 |
| 2010/0276611 A1* | 11/2010 | Camm et al. ............... 250/492.2 |
| 2011/0198511 A1* | 8/2011 | Graupera et al. ......... 250/396 R |
| 2011/0272592 A1* | 11/2011 | Kellogg et al. ........... 250/396 R |

* cited by examiner

AUTOMATED ION BEAM IDLE

TECHNICAL FIELD OF THE INVENTION

The present invention relates to focused ion beam sources and more specifically to the means of controlling power to the focused ion beam sources.

BACKGROUND OF THE INVENTION

Focused ion beam (FIB) systems are used in a variety of applications in integrated circuit manufacturing and nanotechnology to create and alter microscopic and nanoscopic structures. FIB systems can use a variety of sources to produce ion, such as a plasma source or a liquid metal ion source (LMIS). A LMIS can provide high resolution processing, that is, a small spot size, but typically produces a low beam current. Until recently, plasma systems were known to use higher beam currents, and thus allow faster material processing, but were incapable of being focused to a spot size small enough for working with nanoscale structures. More recently, however, inductively coupled plasma (ICP) sources have been developed which are capable of providing charged particles within a narrow energy range, which allows the particles to be focused to a small spot. Such an ICP source is described by Keller et al., in "Magnetically Enhanced, Inductively Coupled Plasma Source for a Focused Ion Beam System," U.S. Pat. No. 7,241,361, which is assigned to the assignee of the present invention and incorporated herein by reference.

When using conventional focused ion beam (FIB) based systems, it is often the case that the system will be used, but then will need to remain idle for some period of time before the ion beam is needed again. In this situation, it is customary to "blank" the beam, rather than shut down the beam altogether. This is largely because of the settling time required when the beam is turned back on, which in some cases may be as long as an hour. Beam blanking is typically accomplished by way of an electrostatic "beam blanker," which can consist of metal plates (from ~5 mm to 10 cm in length) in the microscope column with a small gap (~0.25 to ~2 mm) where the beam passes, which will deflect the beam when a voltage (from ~5 v to ~400 v) is applied to one plate, while the other is kept at ground potential. The beam blanker is located immediately upstream from an aperture plate having a small opening for the beam. The beam is blanked (prevented from reaching the sample) when the voltage is applied to the beam blanker because the deflection of the beam makes it miss the opening in the subsequent aperture plate. This results in the beam striking the aperture plate or even the beam blanking plates.

When the ion beam is blanked, it is thus prevented from striking the sample (and causing unintended damage to the sample) but the beam is still being generated and causing wear in the column. The beam blanking plates and the aperture plate, which the beam is striking while blanked, are themselves slowly destroyed by the ion beam. Many FIB systems also include other apertures in the column above the blanking plane (such as a beam acceptance aperture) which are also being struck and slowly destroyed while the beam is in operation.

Even though beam blanking causes some degree of destruction of the apertures, as well as other wear on the column itself, it has typically been seen as more desirable that turning off the ion source completely. In a LMIS, when the ion source is completely turned off, the ions tend to go completely cold thermally. For a plasma source, the source is usually turned off by extinguishing the plasma. In either case, turning the beam back on involves some period of settling time before the tool will operate reliably. In some cases, this settling time can be as much as an hour. Thus, there is a predisposition among operators of prior art FIB systems to leave the FIB systems on when not used because of the lengthy amount of time required to turn the systems off, back on, and then to return to an operational steady-state.

What is needed therefore is an improved method and apparatus for shutting down an ion beam, whether in a LMIS or ICP system, that does not cause damage to the apertures above the blanking plane and that does not require an unacceptably long time for the system to settle once the ion beam is restored.

SUMMARY OF THE INVENTION

An object of the invention is to provide an improved method and apparatus for shutting down and restoring an ion beam in an ion beam system. Preferred embodiments provide a system for improved power control of a focused ion beam source, which utilizes an automatic detection of when a charged particle beam system is idle (the beam itself is not in use) and then automatically reducing the beam current to a degree where little or no ion milling occurs at any aperture plane in the ion column.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

Figure 1:
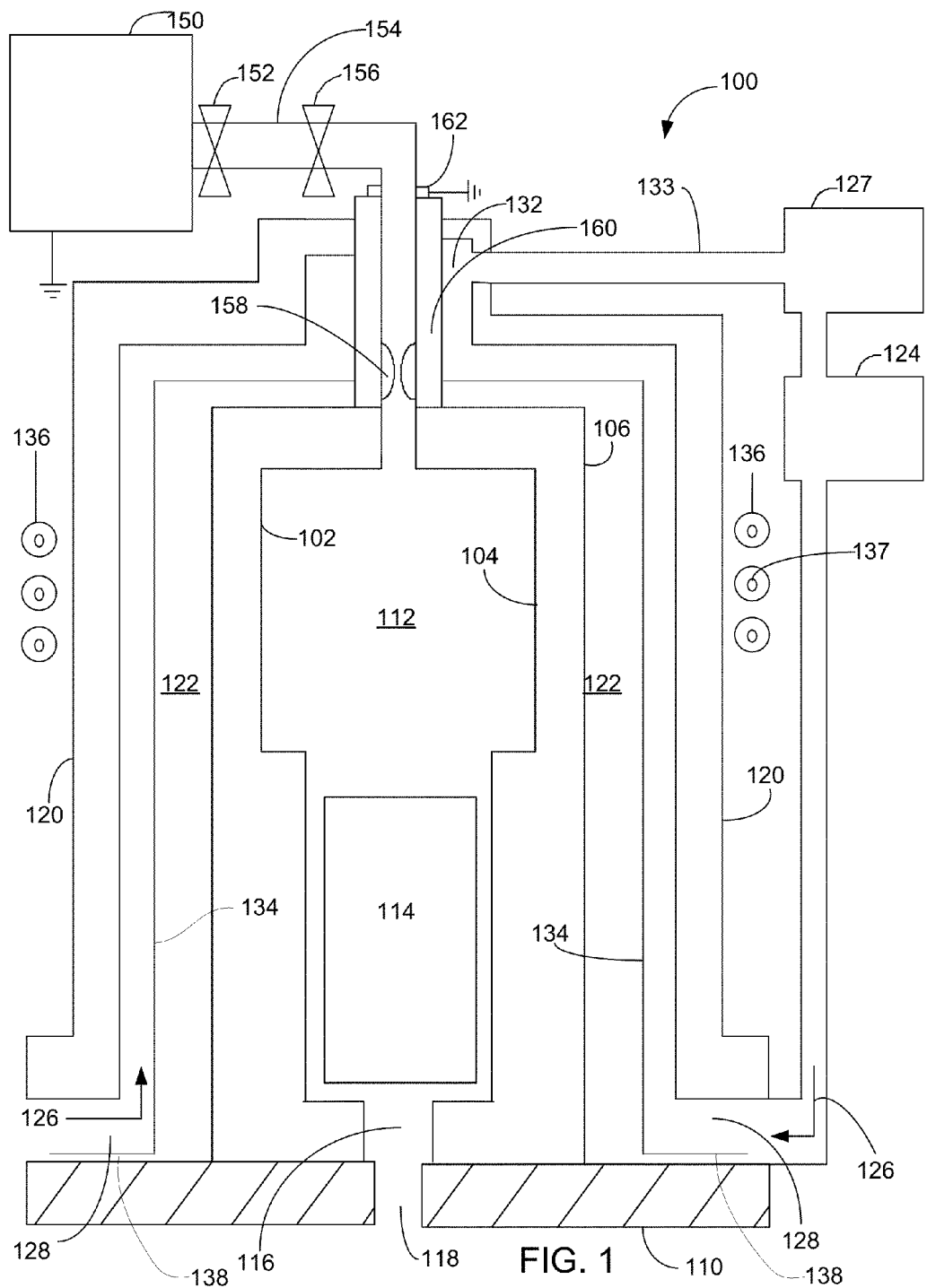
FIG. 1 shows a longitudinal cross-sectional schematic view of a plasma source that uses a Faraday shield for reduced coupling and an insulating fluid for high voltage isolation and cooling.

The accompanying drawings are intended to aid in understanding the present invention and, unless otherwise indicated, are not drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Preferred embodiments provide a system for preventing ions from passing through an ion column in an ion beam system when the ion beam is idle and for restoring the ion beam when it is needed again without requiring an extensive settling time before the ion beam system can be operated reliably. According to preferred embodiments, an automatic power control system can be used to automatically detect when a charged particle beam is idle and then reduce the beam current to a degree where little or no ion milling occurs at any aperture plane in the ion column. When the charged particle beam system is readied for additional operation of the charged particle beam, the beam current can be increased with little or no settling time, as described in greater detail below.

Various methods of detecting when the beam is idle can be employed according to embodiments of the present invention. As used herein, the term "idle" is used to refer to a condition where the beam is not being used for sample processing such as milling or imaging. These various methods of determining when the beam is truly idle could be employed separately or together in the same system. For example, the system can be considered idle if the beam remains blanked for a period of time longer than a preselected interval, or if there is no operator input to the system (whether through a keyboard or pointing device) over a preselected time period. Where the absence of operator input is used to determine whether a system is idle, it must also be confirmed that the system is not running an automated recipe that does not require operator intervention. Also, even if the beam remains blanked, various types of activities (such as stage movement or the operation of any type of automatic sample loading device) could be detected and used to determine whether beam operation is imminent and if so consider the system to not be idle.

Preferably, if the system is determined to be idle, the system can go into an "idle state" where at least one parameter is adjusted to reduce the beam current to a degree that little or no charged particle beam milling occurs at any aperture plane. This reduction of beam current can be accomplished, for example, by extinguishing the plasma for an ICP system or by turning off the source in a LMIS system, but in either of those cases restarting the beam requires a certain amount of settling time before the source can be reliably operated. The settling time for re-igniting the plasma can be as much as an hour, while restarting a LMIS first requires a start-up routine that may take 5-10 minutes, followed by an additional settling time of another 5-10 minutes. Even where settling times only require an additional 10-20 minutes, that wasted time is non-trivial in many types of material processing where high throughput is very valuable. As a result, best practices in the operation of FIB systems have long been to keep everything on and stable as long as the system is in operation. Blanking periods of several hours are not uncommon, which can result in a great deal of damage to the electrodes and apertures in the column which are above the beam blocker and under constant bombardment.

Applicants have discovered, however, that most if not all of the benefits of turning off the ion source can be achieved by simply preventing most if not all of the ions from being accelerated down the column. For a plasma system, for example, instead of extinguishing the plasma, an idle state according to a preferred embodiment of the present invention can be instituted by ramping the voltage on the extraction electrode down to zero (relative to the plasma). As a result, ions will no longer be extracted from the plasma and accelerated down the column. As described in greater detail below, this eliminates or greatly reduces any required settling time while also protecting the apertures in the column above the beam blanker from being damaged by a blanked ion beam. In preferred embodiments, this idle state can be instituted automatically based upon a determination that the beam is truly idle, as also described below.

FIG. 1 shows a stylized longitudinal cross-sectional view of a plasma source 100. The plasma source 100 includes a dielectric plasma chamber 102 having an interior wall 104 and an exterior wall 106. Plasma chamber 102 rests on a conductive base plate 110. Plasma 112 is maintained within the plasma chamber 102. As described in greater detail below, extraction optics 114 extract charged particles, ions or electrons depending on the application, from plasma 112 through an opening 116 in plasma chamber 102 and opening 118 in base plate 110. A dielectric outer shell 120, preferably of ceramic or plastic material that transmits radio frequency energy with minimal loss, is concentric with plasma chamber 102 and defines a space 122 between outer shell 120 and plasma chamber outer wall 106. A split Faraday shield 134 is located in space 122 and is typically concentric with the plasma chamber 102. A pump 124 pumps a cooling fluid 126 from a reservoir/chiller 127 to space 122 through cooling fluid inlets 128 and exit through exit 132, cooling plasma chamber 102 by thermal transfer from outer wall 106.

The split Faraday shield 134 is typically fixed to ground potential and therefore the electrical potential drops rapidly between the plasma region and the split Faraday shield, thus materials between the plasma region and the split Faraday shield must have sufficiently large dielectric strength to resist arcing. The cooling fluid can be chosen to have a sufficiently high dielectric constant compared to the material of ceramic housing 102 so that the voltage drop across the fluid is sufficiently low to prevent dielectric breakdown at the operating voltage. A liquid coolant is chosen to be free of gaseous bubbles or other impurities which could present the opportunity for field enhancement and gaseous electric discharge. The cooling fluid can also be chosen to be slightly conductive in which case the fluid volume will be substantially free of electric fields and substantially all of the voltage drop will take place in the plasma chamber 102. The cooling fluid should also have sufficient heat capacity to prevent the plasma chamber 102 from overheating without requiring a large fluid flow that requires a large pump that would consume excessive power. The plasma chamber outer wall 106 is typically maintained at a temperature of less than about 50° C.

A Faraday shield 134 passes the radio frequency energy from RF coils 136 to energize the plasma while reducing the capacitive coupling between radio frequency coils 136 and plasma 112. In some embodiments, the Faraday shield 134 is protected from corrosion and physical damage by being substantially encapsulated in a solid dielectric media, such as ceramic, glass, resin, or polymer, to eliminate unwanted fluid in contact with the Faraday shield and to eliminate high voltage discharge. RF coils 136 may be hollow and cooled by flow of a fluid coolant through the internal passages 137 in the coils. The plasma chamber coolant system may also pump fluid coolant through the coils, or the coils can have an independent cooling system.

Gas is provided to plasma chamber 102 from a gas source, such as a tank 150. Tank 150 is typically maintained at ground potential and contains the gas at a high pressure. A regulator 152 reduces the pressure of the gas leaving the tank entering a conduit 154. An optional adjustable valve 156 further reduces the pressure in the gas line or closes the conduit completely when the source is not in use. A flow restrictor, such as a capillary 158, further reduces the gas pressure before the gas reaches plasma chamber 106. Restrictor 158 provides a desired gas conductance between the gas line and the interior of plasma chamber 102. Restrictor 158 is preferably in electrical contact with plasma 112 and so is at the plasma potential. In other embodiments, the flow restriction can have an electrical bias applied from a voltage source other than the plasma. An insulating shield 160 surrounds capillary 158 and a grounded metallic collar 162 at the end of insulating shield 160 ensures that the electrical potential of the gas is zero at that position. Thus, the entire electrical potential change from ground to the plasma voltage occurs within insulating shield 160 in which the gas is at a relatively high pressure and therefore resistant to arcing.

In one example embodiment without a valve 156, regulator 152 reduces the pressure of the gas leaving the supply tank from 150 psig to 5 psig. The gas pressure remains at 5 psig until the gas reaches capillary 158, and which point the gas pressure drops to the plasma chamber pressure of, for example, 0.1 Torr. Insulating shield 160 preferably has sufficient length to keep the field sufficiently low to prevent a damaging discharge. Insulating shield 160 is typically about at least 5 mm long, and more typically between about 30 mm and 60 mm. For example, if the plasma is maintained at 30 kV, the electric field within a 10 mm shield is about 3 kV/mm, which is sufficiently low to prevent a sustained discharged in most applications. Skilled persons will understand that the local electric field will be a function of the geometry and that initial low current discharges may occur to reach a static charge equilibrium within insulating shield 160. In some embodiments, valve 156 may reduce the gas pressure further before the gas reaches the final restrictor before the plasma. Instead of a capillary, the flow restrictor could be a valve, such as a leak valve. Any type of gas source could be used. For example, the gas source may comprise a liquid or solid material that is heated to produce gas at a sufficient rate to supply the plasma. The different output pressures of the different gas sources may require different components to reduce the pressure to that required in the plasma chamber.

Figure 2:
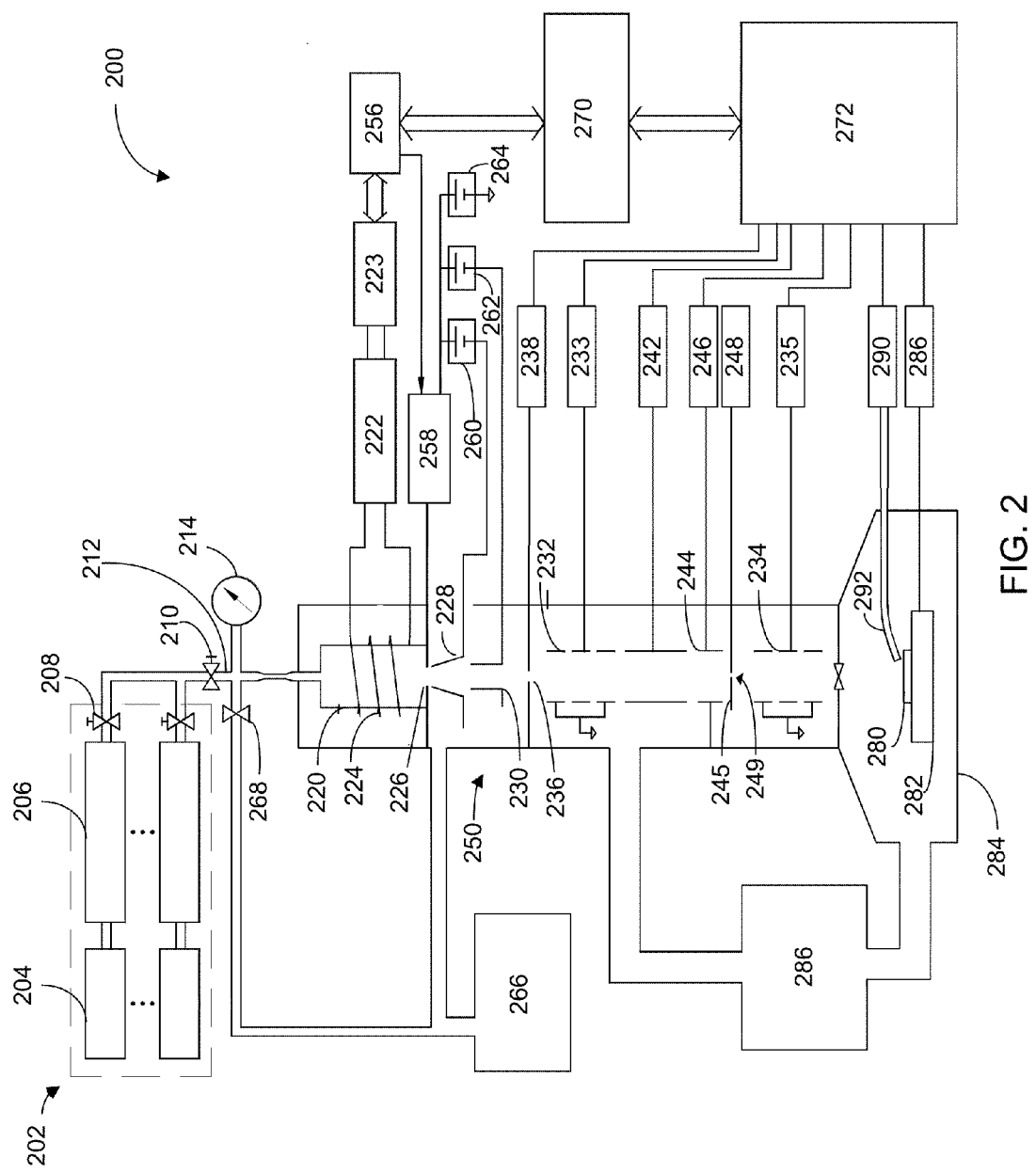
FIG. 2 shows a charged particle focused ion beam system that uses an inductively coupled plasma source.

FIG. 2 is a schematic diagram of a particle optical apparatus 200 with an inductively coupled plasma (ICP) ion source comprising an automatic power control system according to preferred embodiments of the present invention. A gas manifold 202 may comprise one or more gas supplies 204 each with its own flow and/or pressure regulator 206. The gas supplies 204 can comprise a variety of different gases or can also be multiple sources of the same gas. Each of the gas supplies 204 may be independently selected by automatic opening of their respective flow valves 208. Activation of a single flow valve corresponds to the case where a single gas species is desired, while activation of more than one flow valve simultaneously corresponds to the case where a gas mixture is desired. The single gas, or gas mixture, is then regulated by a final flow valve 210 leading to gas feed tube 212 to plasma source tube 220, within which a plasma is generated. The plasma source tube can alternatively be called a plasma chamber. A pressure gauge 214 monitors the gas pressure in the gas feed tube 212. The gas feed tube 212 may be evacuated by source turbopump 266 through vent valve 268. Source turbopump 266 can also pump unwanted contaminants, for example, particles from a formed coating, from the source tube 220.

RF power is provided by RF power supply 223 and is fed to the plasma tube 220 through a match box 222 which is connected to an RF antenna 224 surrounding the source tube 220. A split Faraday shield (not shown) is preferably positioned between the antenna 224 and plasma tube 220 to reduce capacitive coupling, thereby reducing the energy spread of the extracted charged particles, and allowing the particles to be focused to a smaller spot. RF power supply 223 could also apply power to the antenna in a "balanced" manner, as described in U.S. Pat. No. 7,241,361, to further reduce energy spread of the particles in the extracted beam. Near the bottom of the plasma source tube 220, a source electrode 226 is biased to a high voltage to apply a high voltage to ions from the plasma. A biasing source power supply 264 is connected to the source-biasing electrode 226 and the plasma is initiated by igniter 258. The source-biasing electrode can be biased to a large negative voltage when an electron beam or beam of negative ions is to be generated or to a high positive voltage when a beam of positive ions is to be generated. For example, the plasma is typically biased to about positive 30 kV when ions are extracted for ion beam milling; the plasma is typically biased to between about negative 20 kV and negative 30 kV when electrons are extracted for EDS analysis or when negative ions are extracted for secondary ion mass spectrometric analysis; and the plasma is typically biased to between about negative 1 kV and negative 10 kV when electrons are extracted for forming a scanning electron beam image. Use of an ICP with a split faraday shield and a balanced antenna to reduce the beam energy spread facilitates the production of a higher resolution beam which is suitable for some applications in which a large spot size would not be adequate.

An extractor electrode 228 in focusing column 250 is biased by a power supply 260, referenced to the output voltage of the biasing source power supply 264. The extractor electrode power supply 260 may be a bipolar power supply. A condenser electrode 230 in the column is biased by a power supply 262, also referenced to the output voltage of the biasing power supply 264 and also possibly a bipolar power supply. Ions are extracted from the plasma contained in the source tube 220 due to the high electric field induced at the lower end of the source tube 220 by the bias voltage on the extractor electrode 228 relative to the voltage on the source biasing electrode 226. The ions extracted from the source tube 220 emerge downwards through the opening, or aperture, in the source-biasing electrode 226, forming a charged particle beam (not shown) which enters the optical column 250.

Two electrostatic einzel lenses 232 and 234 within the column are shown for focusing the ion beam onto sample 280 mounted on stage 282, which is controlled by stage control 286 at the bottom of sample chamber 284; however the exact number and type of lenses is not part of the present invention. A sample chamber turbopump 286 ensures a vacuum is maintained within the chamber 284 and column 250 by removing excess gas particles. Turbopump 286 can also be used to remove contaminants from the column 250 and/or sample chamber 284. Electrostatic lenses 232 and 234 are controlled by high voltage power supplies 233 and 235, respectively. The lenses 232 and 234 can be also bipolar lenses.

Between the first einzel lens 232 and the second einzel lens 234 in the ion column, a beam defining aperture assembly 240 is mounted, comprising one or more beam defining apertures (three apertures are shown in FIG. 1). Typically, the beam defining aperture assembly 240 would comprise a number of circular apertures with differing diameter openings, where any one of which could be positioned on the optical axis to enable control of the beam current and half-angle at the substrate surface. Alternatively, two or more of the apertures in the beam defining aperture assembly 240 may be the same, thereby providing redundancy to enable the time between aperture maintenance cycles to be extended. By controlling the beam half-angle, together with corresponding adjustments of the lenses, the beam current and diameter of the focused ion beam at or near the substrate surface may be selected, based on the spatial resolution requirements of the milling or imaging operations to be performed. The particular aperture to be used (and thus the beam half-angle at the substrate) is determined by mechanical positioning of the desired aperture in the beam defining aperture assembly 240 on the optical axis of the column by means of the beam defining aperture (BDA) actuator 242, controlled by the FIB system controller 272.

Figure 3:
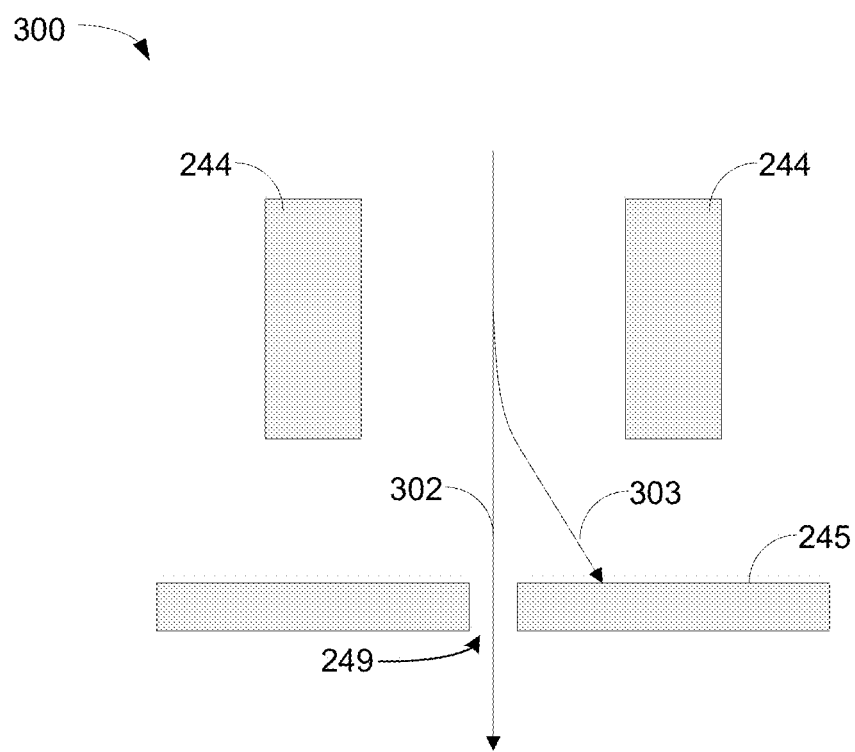
FIG. 3 shows a schematic diagram depicting a conventional beam blanking apparatus used in prior art focused ion beam systems.

FIG. 3 is a schematic diagram depicting a conventional beam blanking apparatus 300 used in focused ion beam systems. As described above, beam blanker deflection plates 244, which deflect the charged particle beam 302, are controlled by a blanker control 246 and are implemented within the column 250. The beam blanker deflection plates 244 are located immediately upstream from an aperture plate 245 having a small opening for the beam. The beam is blanked (prevented from reaching the sample) when the voltage is applied to the beam blanker 244 because the deflection of the beam makes it miss the opening in the subsequent aperture plate 245. This results in the beam striking the aperture plate or even the beam blanking plates. Alternatively, aperture plate 245 can form a Faraday cup, which can be used to measure beam current.

Referring again to FIG. 2, a programmable logic controller (PLC) 256 provides control and automation for the RF power source 223 and the igniter 258. The Plasma Source Controller 270 controls the various voltages of the ICP ion source, ion extraction optics, and optionally other components in the system including spectrometer 252, and PLC 256. Plasma Source Controller 270 can also provide feedback to Focused Ion Beam (FIB) System Controller 272 from the PLC 256 and the spectrometer 252. The FIB System Controller 272 has overall responsibility for the proper operation of charged particle apparatus 200, as illustrated by the various control links shown schematically in FIG. 2.

The FIB System Controller 272, for example, is capable of controlling BAA Actuator 238, high-voltage lens power supplies 233 and 235, BDA actuator 242, blanker control 246, electrometer 248, spectrometer 290, stage control 286, and Plasma Source Controller 270, which in turn controls other components as described above. The user can input a certain set of operating parameters, such as a pre-defined intensity level or a pre-defined max power, to FIB System Controller 272 or Plasma Controller 270, and these controllers can vary certain system parameters such as RF power, flow, and pressure settings, so that the properties of the plasma match the set of predetermined parameters. The user can also input desired operating parameters such as beam current, lens voltages, beam acceptance angle, mass filter deflection angles, electrode voltages, and beam blanker deflection angles such that the FIB System Controller 272 will monitor and adjust the parameters of the apparatus to match the desired parameters. Skilled persons will recognize that this input can easily be accomplished with a computer or directly to the system controller through another input device.

Figure 4:
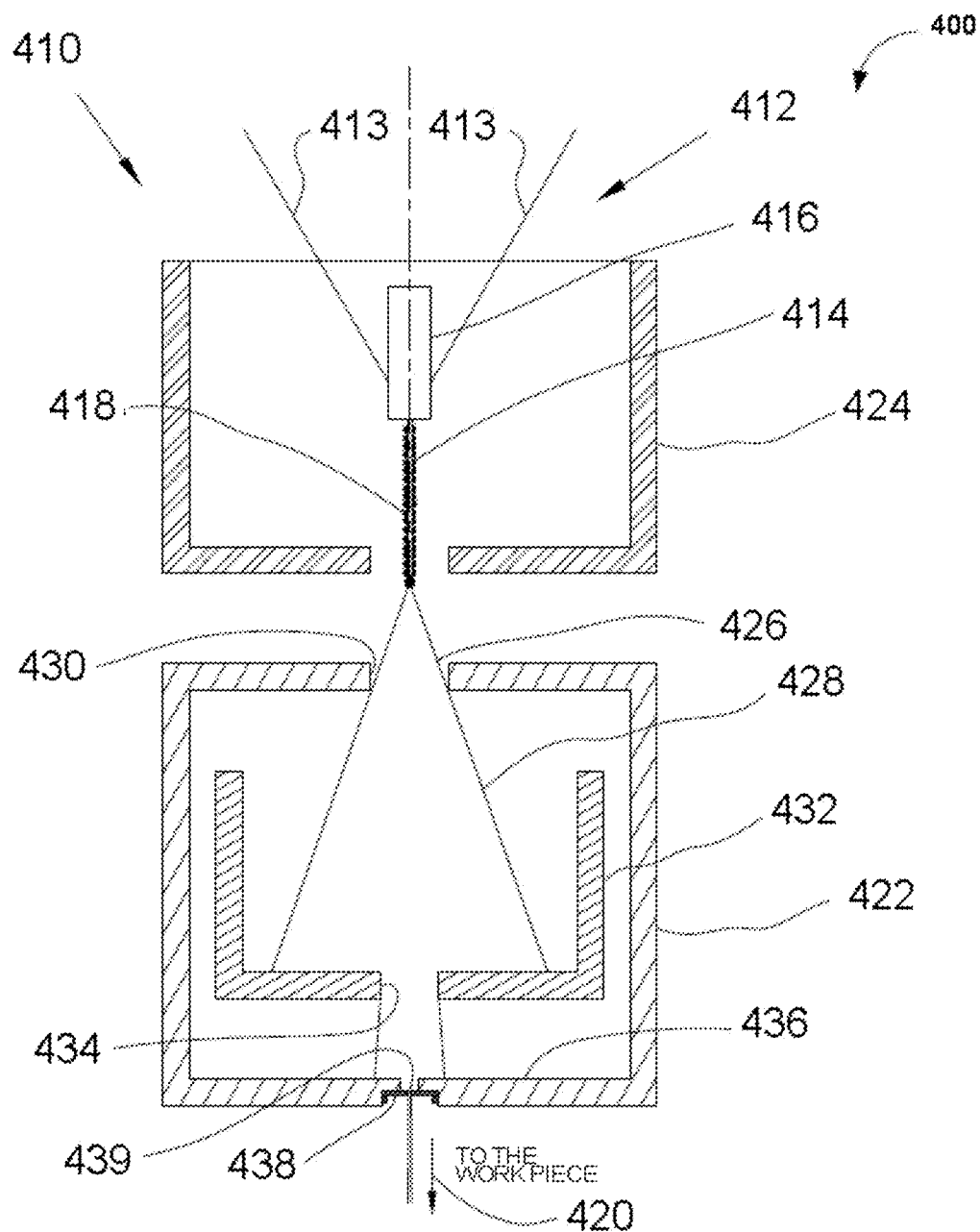
FIG. 4 shows a charged particle focused ion beam system that uses a liquid metal ion source (LMIS)

FIG. 4 shows a liquid metal ion source (LMIS) assembly 400 in a charged particle focused ion beam system suitable for use with an automatic power control system according to preferred embodiments of the present invention. The LMIS 412, suspended by an electrical filament 413, includes a needle shaped emitter 414 and a supply of liquid metal shown contained in a reservoir 416. The capacity of the reservoir 416 and the quantity of liquid metal is selected to ensure it does not become the source life limiter. The liquid metal runs from the reservoir 416 and down the emitter 414 in a thin film represented here by multiple drops 418. When the liquid metal reaches the end of the emitter 414, metal ions are extracted from the emitter and accelerated in a direction 420 toward a work piece by an extraction electrode 422. The ion current is controlled by the interaction between the flow of liquid metal atoms down the source 412, the electric potential of the extractor electrode or extraction cup 422, and the electric potential of a current control or suppression electrode 424. Once the ions are extracted from the LMIS, they are accelerated through the column by an electrical potential between the sample and the source.

As the ions leave the emitter 414, they are formed into a beam 426. The beam 426 spreads as it leaves the source forming an emission cone 28 with the apex of the cone at tip of the emitter 414. The beam 426 passes through a number of apertures in the beam limiting and extraction members as the ions move toward the work piece 420. Each of these apertures limit the outer envelope commonly referred to as the beam diameter. The beam 426 passes into the extraction cup 422 through a top aperture 430. The shield 432 has a bottom aperture 434 smaller than the extraction electrode top aperture 430 which allows only the central portion of the beam 426 to pass. The portion of the beam 426 that passes through the shield bottom aperture 434 impinges on a bottom plate 436 of the extraction cup 422.

The bottom plate contains a beam defining aperture or BDA 438. The term beam defining aperture (BDA) is usually used to describe the disk shaped element itself as well as the hole, or aperture 439 that passes through it. The aperture 439 in the BDA is significantly smaller than the other apertures in the arrangement and consequently allows only a small fraction of the original beam to pass through to the work piece. The majority of the beam impacts the shield 432, and the BDA 438. Once the ions pass through the BDA, they are focused onto the workpiece in a conventional focused ion column (not shown). Typically, a conventional beam blanking apparatus such as the one shown in FIG. 3 would be implemented with the focused ion column and used to blank the beam.

Figure 5:
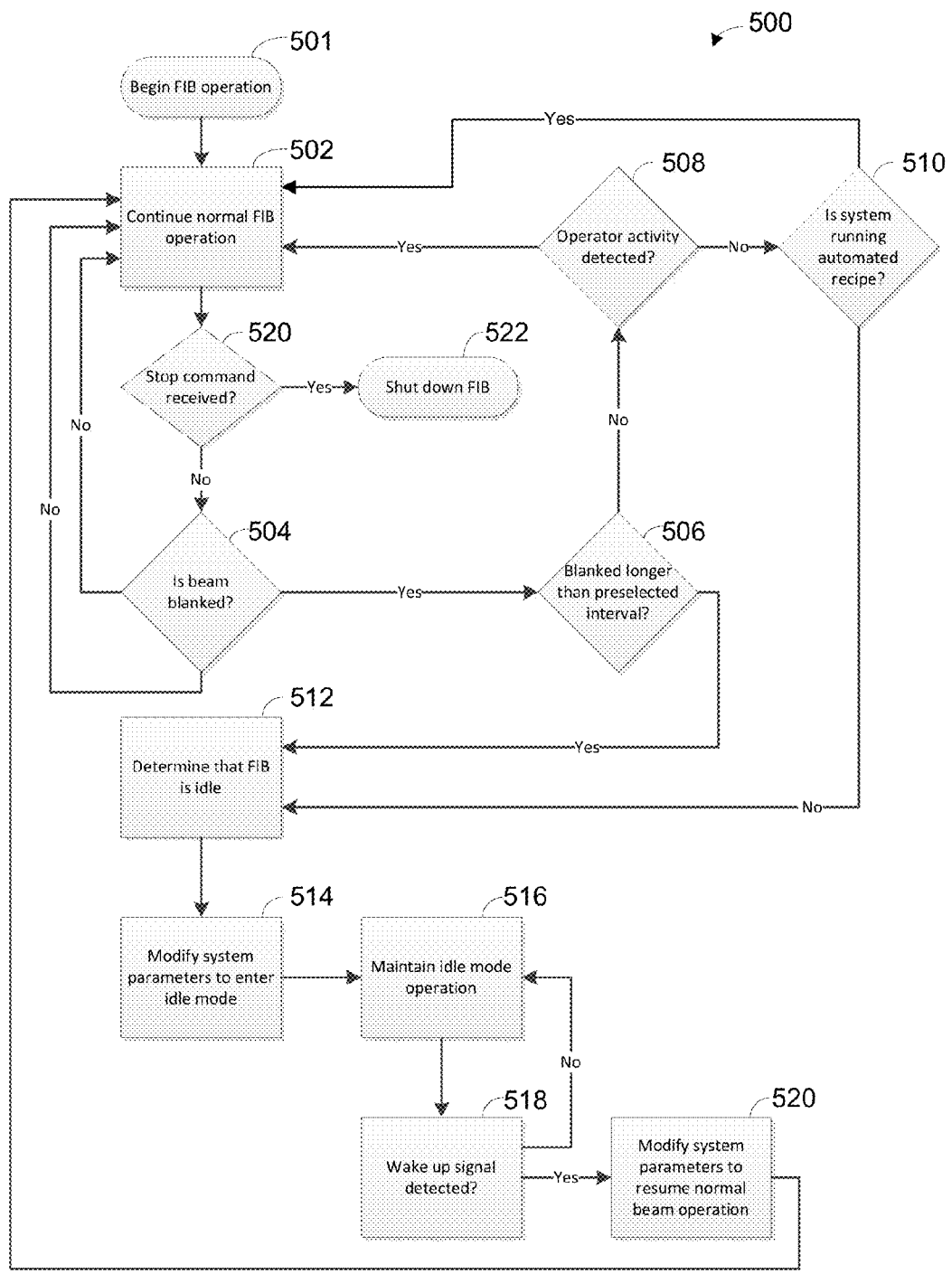
FIG. 5 shows a preferred method of managing power to a charged particle beam system in accordance with the present invention.

FIG. 5 shows a preferred method of managing power to a charged particle beam system in accordance with the present invention. In some embodiments of FIG. 5, method 500 is operable by a charged particle beam system that includes a focused ion beam source, one or more focusing lenses for focusing charged particles from the focused ion beam source, an extractor electrode and a system controller. In some embodiments, the focused ion beam source can be an ICP source including a plasma ion chamber and a source-biasing electrode. In other embodiments, the ion beam source can be a LMIS having a needle shaped emitter 414 and a supply of liquid metal to which a voltage can be applied.

According to the preferred method 500 of FIG. 5, in step 501, FIB operation is started. Any type of FIB system can be used according to preferred embodiments of the present invention, including plasma FIB systems using an ICP source or FIB systems using a liquid metal ion source (LMIS). Embodiments of the present invention could be advantageously applied to any type of charged particle beam system where the portion of the column above the beam blanker is damaged during operation of the charged particle source. In fact, preferred embodiments of the present invention could be applied in ion beam systems that do not employ or include a beam blanker at all, since one of the principal uses for a beam blanker would be unnecessary when making use of the present invention.

Once the beam system is in normal operation mode, the system can automatically determine whether the system should be placed into an idle mode. Steps 504 to 510 illustrate one possible method for determining whether the system is idle, although other methods could be employed. In step 504, it is determined whether the beam has been blanked. The ion beam is blanked when ions are not being directed to the sample by a beam blanker such as the one shown in FIG. 3. If not, the system continues normal FIB operation. Once the beam is blanked, however, a timer begins to measure the time that the beam has been blanked. It is common for the beam to be blanked during actual operation of the beam (when moving the beam to a different point on the sample surface for example). Blanking during operation is typically for a very brief interval. There may also be time periods when the instrument is carrying on some other operation (such as moving the sample stage or operating another beam column in a multi-beam system). As a result, the operator will typically wish to select a somewhat longer period of time before the system will enter idle mode. In some preferred embodiments, the preselected time will be on the order of several hours, although longer or shorter times could be selected depending upon the circumstances.

In step 506, it is determined whether the beam has been blanked for longer than the preselected interval (the time that the beam is allowed to sit idle before entering idle mode). While the timer is running, if the beam is unblanked, the timer will preferably reset and begin running again when the beam is once again blanked. If yes, a determination is made that the FIB is idle in step 512. If not, optionally additional steps can be taken to determine if the beam is actually idle. In step 508, it is determined whether any operator activity is detected. Examples of operator input are keyboard activity of the charged particle beam system or activity of a mouse pointing device of the charged particle beam system. If operator activity is detected, that is an indication that the FIB system is not idle and normal operation is continued. If no operator activity is detected, it is determined in step 510 whether the instrument is running an automated recipe, which will often not require any operator intervention. If such an automated recipe is running, that is also an indication that the FIB system is not idle and normal operation is continued. In some embodiments, a timer can also be used to determine whether there has been no operator input for a preselected time before determining that the FIB system is idle.

In some preferred embodiments of the present invention, the optional steps 508 to 510 could be used in place of steps 504 to 506, rather than in addition to those steps. In other preferred embodiments of the present invention, additional methods of determining an idle state could be used, either in place of the methods described above, or in addition to those methods. For example, an idle mode could be automatically entered by way of an automatic recipe (when other steps in the recipe will take enough time that entering an idle mode is warranted). An idle state could also be entered by way of an operator indication (such as an "idle" button) with the modification of one or more beam parameters carried out automatically.

If the beam has been blanked for longer than the preselected time and optionally if there is also no operator activity, a determination is made in 512 that the FIB 15 idle. At that point, in step 514, certain system parameters can be modified to put the beam column into an idle mode that minimizes or eliminates damage to the column above the beam blanker. As described below, the exact system parameters that are modified will depend in part upon the type of FIB source being used, whether ICP or LMIS. In some preferred embodiments, once the determination is made that the system is idle, a notification and an "abort" button can be displayed on the screen for a period of time to give an operator a chance to stop the system from entering idle mode. If a user does not respond within the allotted time, the system can be placed into idle mode and a notice displayed, for example on a computer display screen, indicating the system status.

Once the system is in idle mode, it will maintain that status in 516 until it receives a signal to wake up. The wake up signal could be any suitable signal, including an actual wake up button or "beam on" indication (executed in hardware or software) or virtually any type of operator input (such as moving the mouse or striking a key on a keyboard). Once the wake up signal is detected in 518, the system parameters will be modified to resume normal beam operations (as described in more detail below) in 520. Once the parameters have been modified, the FIB system can continue normal operation in 502. Once the sample processing has been completed, a stop or shut down command can be entered by the operator. Once a stop command in received in 520, the system is completely shut down in 522.

Method 500 can be performed by the focused beam system controller 353 in the LMIS system of FIG. 2 or by a similar controller (not shown) in the LMIS system of FIG. 4.

As discussed above, the exact system parameters modified to place the FIB system into idle mode will depend upon the type of FIB system being used. For ICP systems, the flow of ions down the column has traditionally been stopped by extinguishing the plasma. While this is certainly effective at preventing wear on the column apertures, it comes at a high price. The settling time required once the plasma is re-ignited may be as much as an hour. Applicants have discovered, however, that leaving the plasma ignited, but ramping down the extractor voltage eliminates, or at least greatly reduces, the flow of ions down the column, but requires almost no settling time when the extractor voltage is restored. Thus, in preferred embodiments of the present invention, an ICP FIB system can enter idle mode by ramping down the voltage on the extractor electrode. Typically, in a modern FIB system, the voltage to the extractor electrode "floats" on the acceleration voltage, which means that the extractor voltage is set relative to the acceleration voltage. In such a system, the voltage of the extractor would be ramped from the extracting voltage (for example, 18 kV) to the acceleration voltage (for example, 30 kV). Because the voltage on the extraction electrode would then match the voltage of the plasma source, there would be no electric potential between the two to draw ions toward the extractor electrode.

In some preferred embodiments, the acceleration voltage also could be ramped down so that there is no electrical potential between the sample and the source. In systems where the extraction voltage floats on the acceleration voltage, the change in acceleration voltage could be in addition to or in place of the ramping down of the extractor voltage. If the two voltages are completely separate, however, some adjustment would likely need to be made to extractor electrode voltage if the acceleration voltage is turned off or greatly reduced in order to avoid electrical arcing. Preferably, the reduction in the two voltages is coordinated so that the relative voltage between the two does not exceed a predetermined difference.

The situation would be somewhat different for a FIB system with a LMIS. For a LMIS there is some significant settling time associated with turning off the extraction of ions from the cone and then turning emission back on. Typically, this settling time is on the order of 5-10 minutes, which is a non-trivial amount of time where high throughput is desired. Also, where the LMIS itself is turned off, it will go cold and require a start-up routine to be completed before the source can be used. Completion of the start-up routine also requires approximately 5-10 minutes. Applicants have discovered, however, that there is little or no settling time associated with changing the acceleration voltage. By reducing or eliminating the voltage on the LMIS tip, while leaving the extraction voltage (relative to the acceleration voltage) unchanged, ions are still extracted from the source up to the extraction plane. Because there is no electrical potential to pull the ions down through the rest of the column, the ions either do not pass the extraction plane at all or, if they do, they do not strike other electrodes or apertures in the column with very much force. A preferred embodiment of the present invention for use with a LMIS system, the acceleration voltage is reduced or eliminated in order to put the system into idle mode, while maintaining an extraction voltage to cause the emission of ions from the LMIS cone.

The invention has broad applicability and can provide many benefits as described and shown in the examples above. The embodiments will vary greatly depending upon the specific application, and not every embodiment will provide all of the benefits and meet all of the objectives that are achievable by the invention. To the extent that any term is not specially defined in this specification, the intent is that the term is to be given its plain and ordinary meaning. The accompanying drawings are intended to aid in understanding the present invention and, unless otherwise indicated, are not drawn to scale.

In the discussion herein and in the claims, the terms "including" and "comprising" are used in an open-ended fashion, and thus should be interpreted to mean "including, but not limited to." Further, whenever the terms "automatic," "automated," or similar terms are used herein, those terms will be understood to include manual initiation of the automatic or automated process or step. The term "FIB" or "focused ion beam" is used herein to refer to any collimated ion beam, including a beam focused by ion optics and shaped ion beams.

Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Materials and structures described in one embodiment or described as part of the prior art may be used in other embodiments. Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle beam system, comprising:
   a focused ion beam source having:
      a plasma ion source comprising a plasma chamber;
      a radio frequency (RF) power supply connected to a RF antenna positioned outside the plasma chamber to transmit RF energy into the plasma chamber to create plasma by energizing gas in the chamber;
      a source electrode for electrically biasing the source to a high voltage; and
      an extractor electrode for extracting ions from the source;
   an ion column including one or more focusing lenses for focusing charged particles from the focused ion beam source onto a sample;
   a system controller for:
      automatically detecting an idle state of the charged particle beam system; and
      in response to detecting the idle state, maintaining plasma in the plasma chamber by continuing to transmit RF energy into the plasma chamber, and automatically modifying a voltage applied to the source electrode and/or the extractor electrode to control the electrical potential between the extractor electrode and the source electrode to prevent ions from passing down the column.

2. The charged particle beam system of claim 1 in which modifying a voltage comprises maintaining a voltage on the extractor electrode that is sufficient to extract ions from the source and reducing the voltage applied to the source electrode to prevent ions from passing down the ion column when an idle state has been detected.

3. The charged particle beam system of claim 2 in which maintaining a voltage on the extractor electrode comprises maintaining a relative potential between the extractor electrode and the source electrode while the voltage applied to the source electrode is reduced so that ions are not accelerated through the ion column.

4. The charged particle beam system of claim 1 further comprising a beam blanker for blanking the ion beam while the charged particle beam is in operation so that ions do not reach the sample.

5. The charged particle beam system of claim 4 in which the system controller detects an idle state of the charged particle beam system when it is determined that the beam is blanked for a time longer than a preselected time.

6. The charged particle beam system of claim 4 further comprising one or more operator input devices to detect an idle state of the charged particle beam system when it is determined that no operator input is detected over a preselected time period and that no automated recipe is running.

7. The charged particle beam system of claim 6 wherein the focused ion beam source comprises an inductively coupled plasma source.

8. A method of controlling a charged particle beam system having a focused ion beam source including a plasma chamber, a radio frequency (RF) power supply connected to a RF emitter positioned outside the plasma chamber, a source biasing power supply, an extractor electrode, a beam blanker, and an ion focusing column, the method comprising:
  transmitting RF energy from the RF emitter into the plasma chamber to energize gas in the chamber, creating plasma for a focused ion beam;
  automatically detecting an idle state of the focused ion beam source when it is determined that the beam is blanked longer than a preselected time or that no operator input from one or more input devices is detected over a preselected time period and no automated recipe is running; and
  when an idle state is detected, maintaining plasma in the plasma chamber and automatically modifying a voltage supplied to at least one of the source and the extractor electrode to control the electrical potential between the source and the extractor electrode to prevent ions from passing through the ion-focusing column.

9. The method of claim 8 in which the charged particle beam system comprises a focused ion beam system with an inductively coupled plasma source.

10. The method of claim 9 in which modifying a voltage comprises maintaining a voltage on an extractor electrode that is sufficient to extract ions from the source and reducing the voltage applied to the source electrode to prevent ions from passing down the column when an idle state has been detected.

11. The method of claim 8 further comprising determining whether a wake-up signal has been received and, if so, automatically modifying a voltage supplied to the source and/or voltage supplied to the extractor electrode to cause ions to be extracted from the ion source and accelerated through the ion focusing column.

12. The method of claim 8 in which the charged particle beam system comprises an inductively coupled plasma source.

13. The apparatus of claim 1 in which modifying a voltage applied to at least one of the source and the extractor electrode to control the electrical potential between the extractor electrode and the source to prevent ions from passing down the column comprises modifying the voltage applied to the source while maintaining the potential difference between the source and the extractor electrode so that ions are extracted from the source but not accelerated down the focusing column.

14. The apparatus of claim 1 in which automatically modifying a voltage applied to the source electrode and/or the extractor electrode to control the electrical potential between the extractor electrode and the source electrode to prevent ions from passing down the column comprises reducing the potential difference between the source electrode and the extractor electrode by changing the voltage on the extractor electrode to the same voltage as that of the source electrode or changing the voltage on the source electrode to that of the extractor electrode to reduce ions extracted from the source.

15. The apparatus of claim 1 in which automatically modifying a voltage applied to the source electrode and/or the extractor electrode to control the electrical potential between the extractor electrode and the source electrode to prevent ions from passing down the column comprises includes reducing the beam current to a degree where little or no ion milling occurs at any aperture plane in the ion column.

16. The method of claim 8 in which automatically modifying a voltage supplied to at least one of the source and the extractor electrode to control the electrical potential between the source and the extractor electrode to prevent ions from passing through the ion-focusing column comprises modifying the voltage applied to the source while maintaining the potential difference between the source and the extractor electrode so that ions are extracted from the source but not accelerated down the focusing column.

17. The method of claim 8 in which automatically modifying a voltage supplied to at least one of the source and the extractor electrode to control the electrical potential between the source and the extractor electrode to prevent ions from passing through the ion-focusing column comprises reducing the potential difference between the source electrode and the extractor electrode by changing the voltage on the extractor electrode to the same voltage as that of the source electrode or changing the voltage on the source electrode to that of the extractor electrode to reduce ions extracted from the source.

18. The method of claim 8 in which automatically modifying a voltage supplied to at least one of the source and the extractor electrode to control the electrical potential between the source and the extractor electrode to prevent ions from passing through the ion-focusing column comprises includes reducing the beam current to a degree where little or no ion milling occurs at any aperture plane in the ion column.

* * * * *